(12) United States Patent
Gum et al.

(10) Patent No.: US 11,015,244 B2
(45) Date of Patent: May 25, 2021

(54) RADIATION SHIELDING FOR A CVD REACTOR

(71) Applicant: GTAT Corporation, Merrimack, NH (US)

(72) Inventors: Jeffrey C Gum, Stevensville, MT (US); Bryce E Clark, Missoula, MT (US); Paul E Gannon, Bozeman, MT (US); Mike McFarland, Oakland, CA (US); Shiva Mandepudi, San Ramon, CA (US)

(73) Assignee: Advanced Material Solutions, LLC, Missoula, MT (US)

( * ) Notice: Subject to any disclaimer, the term of this patent is extended or adjusted under 35 U.S.C. 154(b) by 1079 days.

(21) Appl. No.: 14/142,982

(22) Filed: Dec. 30, 2013

(65) Prior Publication Data

US 2015/0184290 A1 Jul. 2, 2015

(51) Int. Cl.
*C23C 16/44* (2006.01)
*C01B 33/035* (2006.01)
(Continued)

(52) U.S. Cl.
CPC ........ *C23C 16/4404* (2013.01); *C01B 33/035* (2013.01); *C23C 14/0641* (2013.01);
(Continued)

(58) Field of Classification Search
CPC .......................... C23C 16/4404; C01B 33/035
(Continued)

(56) References Cited

U.S. PATENT DOCUMENTS 3,058,812 A 10/1962 Ting et al.
3,746,496 A 7/1973 Dietze
(Continued)

FOREIGN PATENT DOCUMENTS

CN 1364203 A 8/2002
CN 1484712 A 3/2004
(Continued)

OTHER PUBLICATIONS

International Preliminary Report on Patentability & Written Opinion dated Jul. 5, 2016 for PCT/US2014/072479 Dec. 29, 2014.
(Continued)

*Primary Examiner* — Charlee J. C. Bennett
(74) *Attorney, Agent, or Firm* — Maine Cernota & Rardin

(57) ABSTRACT

A reaction chamber includes an enclosure having an interior coated with a metal nitride compound providing an average reflectivity to internal infra-red radiation of greater than 90%. The metal nitride compound can be titanium nitride, zirconium nitride, hafnium nitride, or a nitride of another metal, and can be between 0.1 and 10 microns thick, preferably between 4 and 5 microns thick. The layer does not tarnish, and can withstand reaction chamber temperatures up to at least 250° C., preferably up to 300° C. It is applied by a deposition process, such as PVD, CVD, thermal spray, or cathodic arc, wherein the enclosure itself is the metal nitride deposition enclosure. Uniformity of deposition can be improved by rotating the deposition source through T degrees and back through T±d, with a total of 360/d repetitions. The reactor can be a CVD reactor that deposits polysilicon onto a heated filament.

20 Claims, 9 Drawing Sheets

(51) Int. Cl.
  *C23C 14/06* (2006.01)
  *C23C 16/24* (2006.01)
  *C23C 16/34* (2006.01)
(52) U.S. Cl.
  CPC .............. *C23C 16/24* (2013.01); *C23C 16/34* (2013.01); *C23C 16/4418* (2013.01)
(58) Field of Classification Search
  USPC ........................................................ 118/728
  See application file for complete search history.

(56) References Cited

U.S. PATENT DOCUMENTS

| | | | |
|---|---|---|---|
| 4,082,414 A | 4/1978 | Berg | |
| 4,150,168 A | 4/1979 | Yatsurugi et al. | |
| 4,173,944 A | 11/1979 | Koppi et al. | |
| 4,311,545 A | 1/1982 | Bugl et al. | |
| 4,364,242 A | 12/1982 | Smith | |
| 4,579,080 A | 4/1986 | Martin et al. | |
| 4,620,984 A | 11/1986 | Hoddinott | |
| 4,632,057 A | 12/1986 | Price et al. | |
| 4,665,307 A | 5/1987 | McWilliams | |
| 4,805,556 A | 2/1989 | Hagan et al. | |
| 4,837,052 A | 6/1989 | Lorimer | |
| 4,938,815 A | 7/1990 | McNeilly | |
| 4,957,711 A | 9/1990 | Min et al. | |
| 5,064,367 A | 11/1991 | Philipossian | |
| 5,156,820 A | 10/1992 | Wong et al. | |
| 5,284,640 A | 2/1994 | Jernegan et al. | |
| 5,327,454 A | 7/1994 | Ohtsuki et al. | |
| 5,345,534 A | 9/1994 | Najm et al. | |
| 5,368,888 A * | 11/1994 | Rigney .................. C23C 10/06 118/500 | |
| 5,792,273 A | 8/1998 | Ries et al. | |
| 5,885,358 A | 3/1999 | Maydan et al. | |
| 5,925,422 A * | 7/1999 | Vandenbulcke .... C23C 16/0272 427/249.12 | |
| 6,001,175 A | 12/1999 | Maruyama et al. | |
| 6,021,152 A | 2/2000 | Olsen et al. | |
| 6,022,412 A | 2/2000 | Vincenzo et al. | |
| 6,067,931 A | 5/2000 | Ghezzo et al. | |
| 6,110,289 A | 8/2000 | Moore | |
| 6,146,714 A | 11/2000 | Beyer et al. | |
| 6,207,941 B1 | 3/2001 | Schmidt et al. | |
| 6,221,155 B1 | 4/2001 | Keck et al. | |
| 6,258,228 B1 | 7/2001 | Reiss | |
| 6,284,312 B1 | 9/2001 | Chandra et al. | |
| 6,319,556 B1 | 11/2001 | Olsen et al. | |
| 6,362,095 B1 | 3/2002 | Woo et al. | |
| 6,365,225 B1 | 4/2002 | Chandra et al. | |
| 6,436,796 B1 | 8/2002 | Mailho et al. | |
| 6,530,990 B2 | 3/2003 | Kong et al. | |
| 6,635,570 B1 | 10/2003 | Galewski et al. | |
| 6,639,192 B2 | 10/2003 | Hertlein | |
| 6,698,184 B1 | 3/2004 | Sowa | |
| 6,703,592 B2 | 3/2004 | Van Bilsen | |
| 6,716,302 B2 | 4/2004 | Carducci et al. | |
| 6,759,632 B2 | 7/2004 | Ducret et al. | |
| 6,872,259 B2 | 3/2005 | Strang | |
| 6,902,622 B2 | 6/2005 | Johnsgard et al. | |
| 7,018,479 B2 | 3/2006 | Goodwin | |
| 7,041,931 B2 | 5/2006 | Jennings et al. | |
| 7,115,837 B2 | 10/2006 | Timans et al. | |
| 7,217,336 B2 | 5/2007 | Strang | |
| 7,323,047 B2 | 1/2008 | Sugawara et al. | |
| 2001/0009255 A1 | 7/2001 | Savas | |
| 2002/0011211 A1 * | 1/2002 | Halpin .................. C03C 17/225 118/715 | |
| 2002/0022135 A1 | 2/2002 | Kock et al. | |
| 2002/0028291 A1 | 3/2002 | Shibata et al. | |
| 2002/0086554 A1 | 7/2002 | O'Donnell et al. | |
| 2002/0092617 A1 | 7/2002 | Shim | |
| 2002/0102403 A1 * | 8/2002 | Leverenz ................ C23C 16/36 428/402 | |
| 2003/0000545 A1 | 1/2003 | Fitzsimmons et al. | |
| 2003/0181065 A1 * | 9/2003 | O'Donnell ................ C23C 4/02 438/778 | |
| 2005/0022743 A1 | 2/2005 | Sakata et al. | |
| 2005/0260354 A1 | 11/2005 | Singh et al. | |
| 2006/0185589 A1 | 8/2006 | Zehavi et al. | |
| 2006/0196603 A1 | 9/2006 | Lei et al. | |
| 2007/0074665 A1 | 4/2007 | Chacin et al. | |
| 2007/0077355 A1 | 4/2007 | Chacin et al. | |
| 2007/0163494 A1 * | 7/2007 | Tokie .................... C23C 14/042 118/301 | |
| 2007/0180676 A1 * | 8/2007 | Hwang ................. H01L 21/681 29/407.01 | |
| 2007/0187363 A1 | 8/2007 | Oka et al. | |
| 2007/0251455 A1 | 11/2007 | Wan | |
| 2008/0072820 A1 | 3/2008 | Burrows et al. | |
| 2009/0071403 A1 | 3/2009 | Choi et al. | |
| 2011/0126761 A1 | 6/2011 | Lee et al. | |
| 2011/0159214 A1 | 6/2011 | Gum et al. | |
| 2011/0318909 A1 * | 12/2011 | Gum ..................... C01B 33/035 438/488 | |
| 2013/0280840 A1 * | 10/2013 | Sonoda ................... C23C 14/24 438/34 | |

FOREIGN PATENT DOCUMENTS

| | | | |
|---|---|---|---|
| CN | 1643178 A | 7/2005 | |
| CN | 1977351 A | 6/2007 | |
| CN | 101351572 A | 1/2009 | |
| CN | 202220083 U | 5/2012 | |
| CN | 103098172 A | 5/2013 | |
| CN | 103270189 A | 8/2013 | |
| EP | 0045191 A1 | 2/1982 | |
| EP | 0529593 A1 | 3/1993 | |
| EP | 1162652 A2 | 12/2001 | |
| EP | 1257684 A1 | 11/2002 | |
| GB | 1131462 A | 10/1968 | |
| JP | S5544509 A | 3/1980 | |
| JP | S59224116 A | 12/1984 | |
| JP | 61281009 | 12/1986 | |
| JP | S62124275 A | 6/1987 | |
| JP | H0165854 U | 4/1989 | |
| JP | 1208312 | 8/1989 | |
| JP | 1992325686 B2 | 11/1992 | |
| JP | 2009293110 A | 8/1994 | |
| JP | 2526883 B2 * | 8/1996 | |
| JP | 2526883 B2 * | 8/1996 | |
| JP | 09-017740 A | 1/1997 | |
| JP | 2002001090 A | 1/2002 | |
| JP | 2006016243 A | 1/2006 | |
| JP | H06240450 A | 12/2009 | |
| JP | WO 2012086568 A1 * | 6/2012 | .............. C23C 14/24 |
| JP | 2013533199 A | 8/2013 | |
| KR | 20020014693 A | 2/2002 | |
| KR | 20020075642 A | 10/2002 | |
| KR | 20050014747 A | 2/2005 | |
| KR | 20080088315 A | 10/2008 | |
| RU | 2023050 C1 | 11/1994 | |
| RU | 2125620 C1 | 1/1999 | |
| WO | 1999031013 | 6/1999 | |
| WO | 2006091413 | 8/2009 | |
| WO | 2009120859 A1 | 10/2009 | |
| WO | 2011040173 A1 | 4/2011 | |
| WO | 2012006029 A3 | 1/2012 | |
| WO | 2011010173 A2 | 6/2012 | |
| WO | WO-2012086568 A1 * | 6/2012 | .............. C23C 14/24 |

OTHER PUBLICATIONS

PCT Search Report dated Mar. 31, 2015 of PCT Application No. PCT/US2014/072479 filed Dec. 29, 2014.
Chinese Office action No. 1 on Patent Application No. 200980116944.2, dated Feb. 6, 2012, 8 pages.
Chinese Office action No. 2 on Patent Application No. 200980116944.2, dated Sep. 4, 2012, 12 pages.

(56) References Cited

OTHER PUBLICATIONS

English translation of First Office action in counterpart Chinese Patent Application No. 200980123874.3 dated Aug. 22,2012, 8 pages.
English translation of Second Office action in counterpart Chinese Patent Application No. 200980123874.3 dated Mar. 19,2013, 2 pages.
English translation of Third Office action in counterpart Chinese Patent Application No. 200980123874.3 dated Oct. 17, 2013, 1 page.
English translation of Office action in Chinese Patent Application No. 200980110775.1 dated Apr. 28, 2012, 5 pages.
English translation of Second Office action in Chinese Patent Application No. 200980110775.1 dated Jan. 14, 2013, 6 pages.
English translation of Third Office action in Chinese Patent Application No. 200980110775.1 dated May 31, 2013, 9 pages.
Examination Report for counterpart European Patent Application No. 09 724 761.3 dated Apr. 9, 2013, 5 pages.
H. Angus Macleod, Thin-Film Optical Filters, Fourth Edition, pp. 45-49, 185-187, Published Mar. 16, 2010, CRC Press, Taylor & Francis Group, United States, 10 pages.
International Preliminary Report on Patentability for PCT/US2009/003763 dated Jan. 5, 2011, 10 pages.
International Search Report and Written Opinion for PCT/US2009/038393 dated Dec. 11, 2009, 9 Pages.
International Search Report and Written Opinion of the International Searching Authority for PCT/US2009/038389 dated Aug. 27, 2009, 11 pages.
Official action for counterpart European Patent Application No. 09 724 761.3 dated Nov. 5, 2013, 6 pages.
Official Action for Japanese Application 2011-502054, dated Sep. 3, 2013, 2 pages.
Official English Translation of JP 61-281009 to Ijuin et al. Obtained from The McElroy Translation Company, Oct. 2013, 11 pages.
PCT Search Report dated Apr. 20, 2010 of Patent Application No. PCT/US2009/003763 filed Jun. 23, 2009, 6 pages.
Russian Office action on Patent Application No. 2010143559/02, dated Apr. 8, 2013, 5 pages.
Extended European Search Report of European Application No. EP14876684, dated Aug. 29, 2017, 6 pages.
Chinese Office Action for Appl No. 201480071670.0 dated Jun. 5, 2018, 13 pages.
Japanese Office Action for Appl No. 2016-543729 dated Aug. 28, 2018, 4 pages.
Chinese Office Action for Appl No. 201480071670.0 dated Apr. 9, 2019, 14 pages.
Japanese Office Action for Application No. 2016-543729 dated Jun. 4, 2019, 3 pages.
Chinese Office Action for Appl No. 201480071670.0 dated Oct. 31, 2019, 14 pages.
Japanese Office Action for Application No. 2018-219060 dated Feb. 4, 2020, 4 pages.
Foreign Office Action for European Patent Appl. No. 14876684.3 dated May 28, 2020, 4 Pages.
European Examination Report for Appl No. 14876684.3 dated Oct. 24, 2019, 4 pages.

* cited by examiner

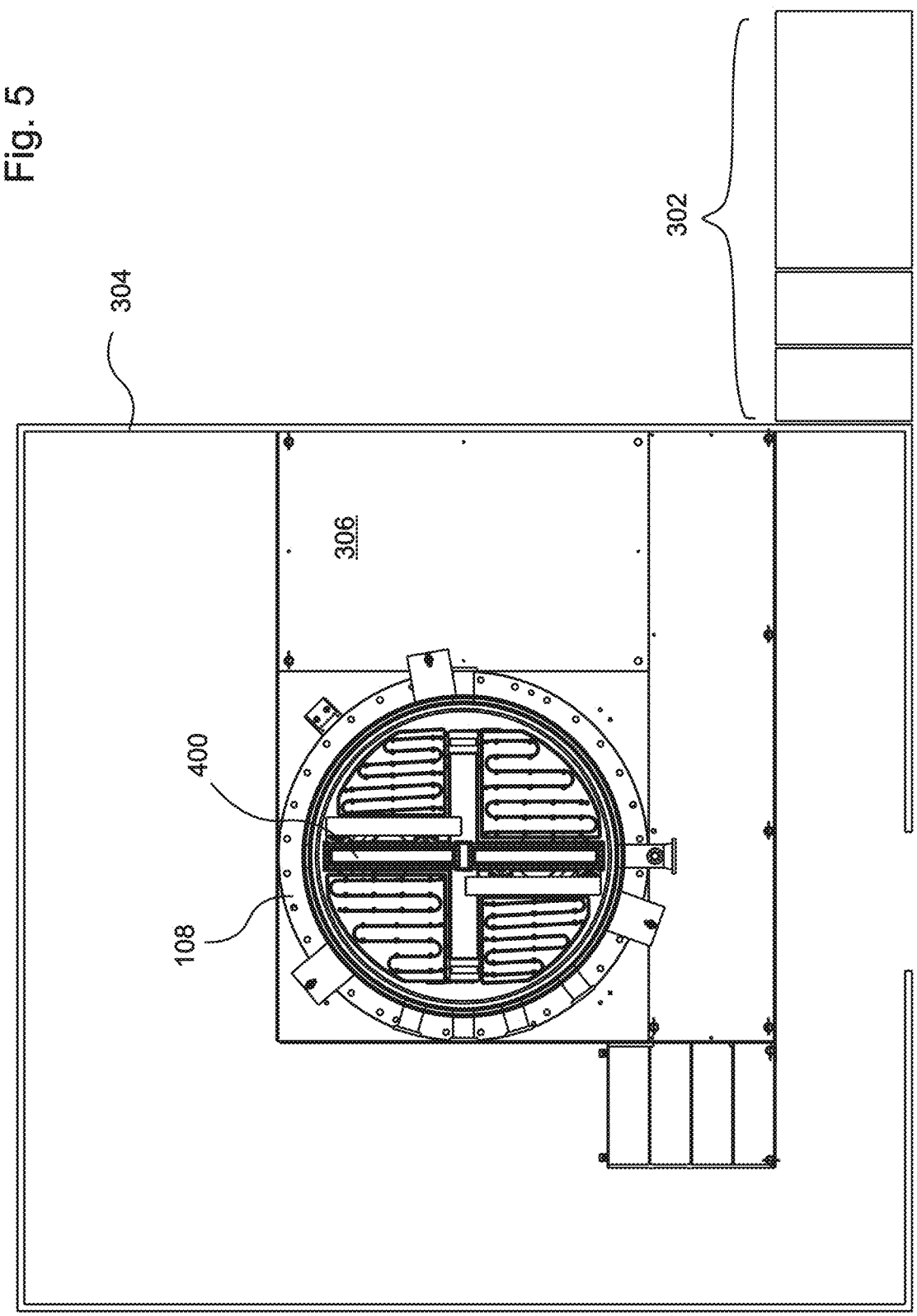

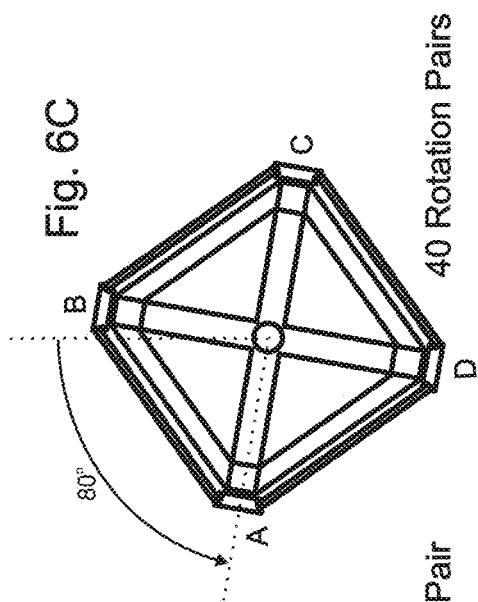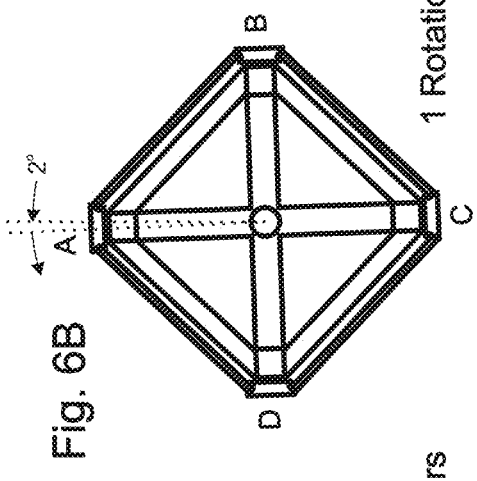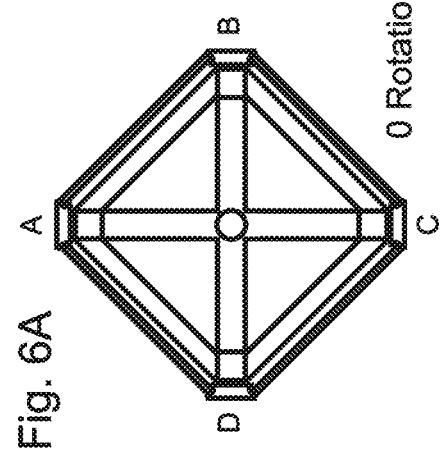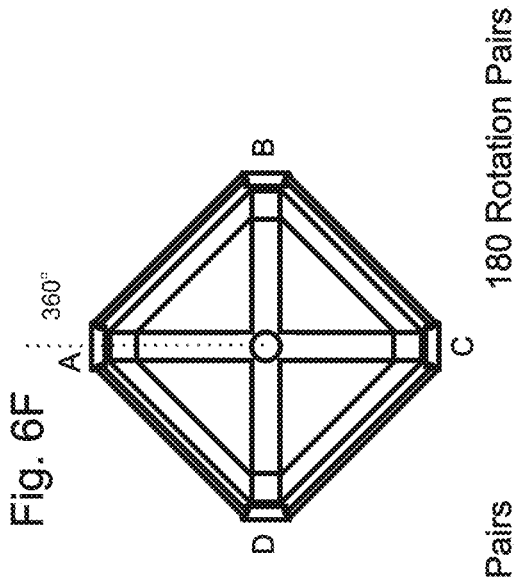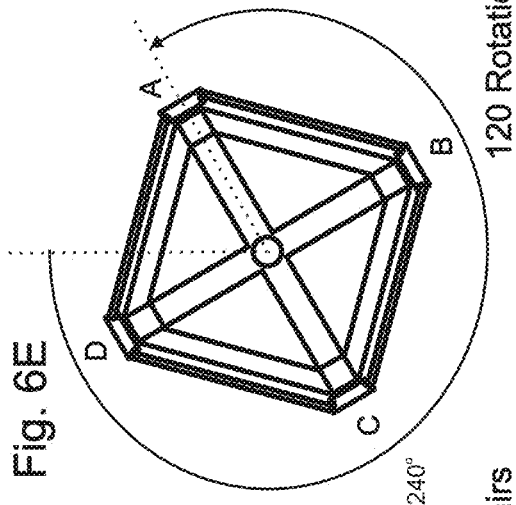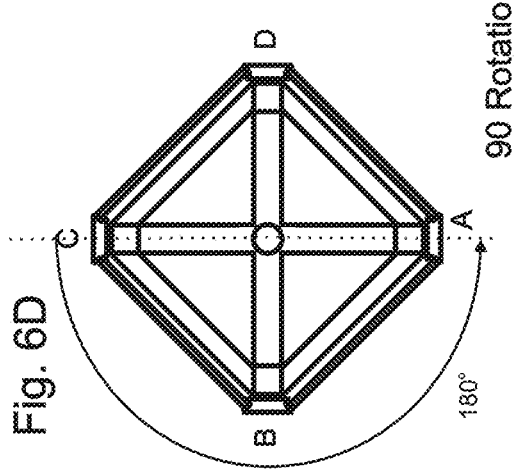

RADIATION SHIELDING FOR A CVD REACTOR

FIELD OF THE INVENTION

The invention relates to high temperature reaction chambers, and more particularly, to high temperature reaction chambers that are used to deposit polysilicon and/or other materials onto heated filaments.

BACKGROUND OF THE INVENTION

In semiconductor fabrication and photovoltaic applications that utilize processes such as chemical vapor deposition (CVD), materials are heated in large furnaces or in reaction chambers to achieve melting and/or deposition of various chemical agents. An example is a CVD reactor configured to deposit polysilicon onto a heated silicon rod.

A typical "Siemens" type polysilicon CVD reactor is illustrated in FIG. 1. Generally, polysilicon is produced in Siemens CVD reactors by the paralytic decomposition of a gaseous silicon compound, such as mono-silane or a chlorosilane (e.g., trichlorosilane), onto a silicon starter "filament." The CVD reactor 100 includes a reaction chamber 104 defined by or having a baseplate 106 and an enclosure, often referred to as a "bell jar" 108 securable to base plate 106. The chamber contains a rod-shaped filament 144 in a U-shaped configuration that is supported by filament supports 112 and electrically accessed through electrical feedthroughs 114 provided in the base plate. The filament is heated by passing electrical current through it while it is exposed to a silicon-containing gas, thereby causing silicon 102 to be deposited onto the filament 144. With reference to FIG. 2, in similar reactors a tubular filament 200, 202 is used in place of a solid rod filament 144. The tubular filament 200, 202 in FIG. 2 includes a pair of vertical silicon tubes 200 joined at the top by a flat silicon bridge 202, forming a U-shaped arrangement.

Bell jar 108 can further comprise one or more heat transfer structures, such as one or more cooling conduits 118. The bell jar 108 can be comprised of a metal such as any of the various grades of stainless steel alloys or other nickel alloys.

In configurations involving a heat transfer medium, such as a coolant or cooling fluid, the one or more cooling conduits 118 typically have at least one conduit inlet port 120 and at least one conduit outlet port 122. Outlet port 122 is fluidly connected to inlet port 120 through one or more channels of the one or more cooling conduits 118.

In some configurations, the CVD reactor 100 is connected to one or more sources of at least one gaseous polycrystalline silicon precursor compound, such as mono-silane or a chlorosilane (e.g., trichlorosilane). Each of the one or more sources is fluidly connected to a reactant inlet of the reaction chamber through, for example, one or more chamber inlet ports 142. During polysilicon fabrication, the one or more filaments 144 are heated, typically by electrical energy from one or more power sources, to a temperature that promotes conversion of the one or more precursor compounds into semiconductor material product 102. Unreacted precursor compounds and byproducts from one or more semiconductor fabrication reactions can exit chamber 104 through at least one chamber outlet port 148.

Because CVD reactors and other high temperature reactors consume large amounts of energy, there is a need to provide improved systems and methods for reducing the radial emission of heat through the outer surface of the reaction chamber 108. One approach is to electroplate a layer 110 of silver onto the inner surface of the reaction chamber 108, which will reflect infra-red energy back into the chamber 108. Alternatively, the reaction chamber can be silver clad. However, silver tarnishes, and thus requires periodic polishing to maintain the increased energy efficiency of the reactor. Also, silver can degrade at elevated wall temperatures, particularly above about 300° C., which limits the maximum operating temperature of the reactor.

Another approach is to electroplate a layer of gold 110 onto the inner surface of the reaction chamber 108. Because gold does not tarnish, the need for periodic maintenance is reduced or eliminated. Also, this decreased internal corrosion improves the quality of the polysilicon produced, because fewer corrosion products are available to contaminate the polysilicon. However, gold is very expensive as a raw material. In addition, as with silver, it is typically necessary to apply the gold layer using an expensive electrochemical apparatus which generates toxic effluent wastes that are environmentally dangerous and expensive to dispose of properly. The gold layer can also degrade above wall temperatures of about 250-300° C., which limits the maximum operating temperature of the reactor.

What is needed, therefore, is a high efficiency high temperature reactor that is more economical to produce than the silver-coated, silver clad, and gold-coated reactors described above, does not require undue maintenance, and can operate at wall temperatures above 300° C. What is also needed is an efficient and economical method for producing such a high efficiency CVD reactor.

SUMMARY OF THE INVENTION

One general aspect of the present invention is a novel reaction chamber that is more economical to produce than the prior art silver-coated, silver clad, and gold-coated reactors described above, does not require undue maintenance, and can operate at wall temperatures above 300° C. A second general aspect of the present invention is an efficient and economical method for producing the improved reaction chamber.

The reaction chamber of the present invention in its most general form includes a base plate and an enclosure attachable to the base plate so as to form a reaction chamber. A layer comprising a metal nitride is applied to an inner surface of the enclosure.

In embodiments, the metal nitride layer provides a reflectivity to internal infra-red radiation of greater than 90%, which is comparable to the reflectivity of prior art silver and gold layers. Note that, as used herein, the term "infrared radiation" refers to light having a wavelength between 0.8 microns and 15 microns. In some embodiments, the metal nitride layer has a thickness that is between 0.1 microns and 10 microns. In some of these embodiments, the thickness of the metal nitride layer is between 4 microns and 5 microns. In various embodiments, the compound is titanium nitride. In other embodiments the compound is zirconium nitride. In yet other embodiments, the compound is hafnium nitride. In still other embodiments, the compound is a nitride of another metal.

Another general aspect of the present invention is a method for producing a reaction chamber enclosure having high thermal efficiency at elevated temperatures. The method includes attaching a compatible deposition base plate to the reaction chamber enclosure so as to form a sealed deposition chamber. The deposition base plate includes a deposition source extending into an interior of the deposition chamber. A controlled atmosphere is then established within the deposition chamber, and a metal nitride layer is deposited onto the interior surface of the reaction chamber enclosure during a deposition period that is sufficient to provide a desired metal nitride layer thickness.

The cost of producing the improved reaction chamber enclosure is reduced due to several factors. First, the metal nitride compound is significantly less expensive than gold. Second, the metal nitride compound is applied by a deposition process, such as Magnetron Sputtering, Ionbeam Assisted Magnetron Sputtering, Cathodic Arc, Filtered Cathodic Arc, Electron Beam Evaporation, Thermal Evaporation, or chemical vapor deposition (CVD), which does not produce toxic effluents and therefore does not require special, costly effluent disposal. In addition, the cost of the deposition apparatus is reduced by using the reaction chamber enclosure itself as part of the metal nitride deposition chamber. The deposition apparatus therefore only requires a compatible base plate having a deposition source and other appropriate fixtures and support apparatus. There is no need to provide a separate, complete deposition chamber that is large enough to contain the reaction chamber enclosure, because the reaction chamber enclosure itself is part of the deposition chamber.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 5 is a top cut-away view of the reactor chamber and deposition apparatus of FIG. 3;

FIGS. 6A through 6F are simplified diagrams that illustrate a deposition source rotation method in an embodiment of the present invention;

DETAILED DESCRIPTION

One general aspect of the present invention is an improved reactor, and in embodiments an improved chemical vapor deposition (CVD) reactor, comprising a reaction chamber that is more economical to produce than gold-coated reactors of the prior art, and which can operate at wall temperatures above 300° C.

Figure 1:
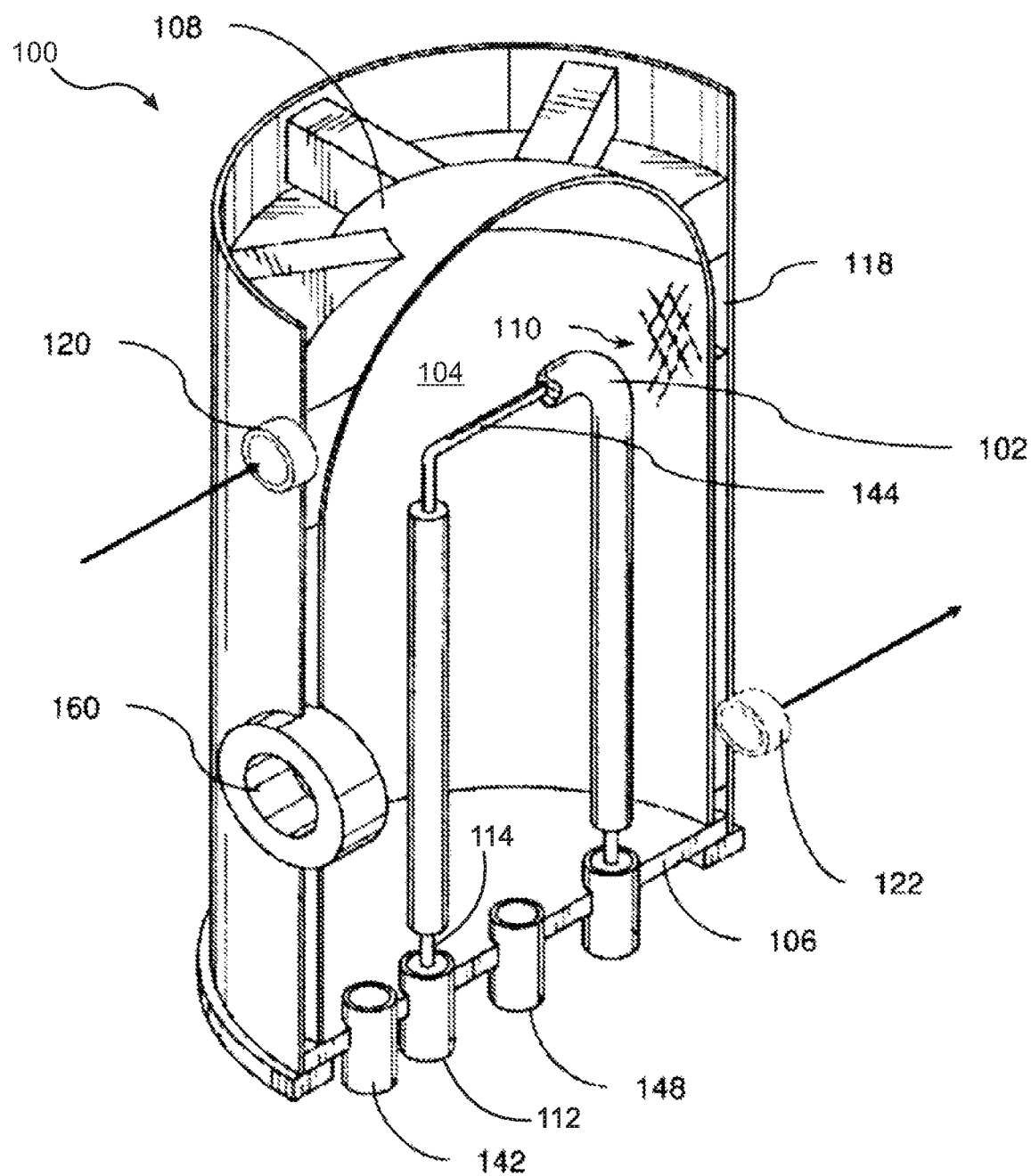
FIG. 1 is a cut-away schematic illustration of a portion of a silicon CVD reactor containing a solid-rod filament, wherein the illustration is applicable to both the prior art and to embodiments of the present invention.
Figure 2:
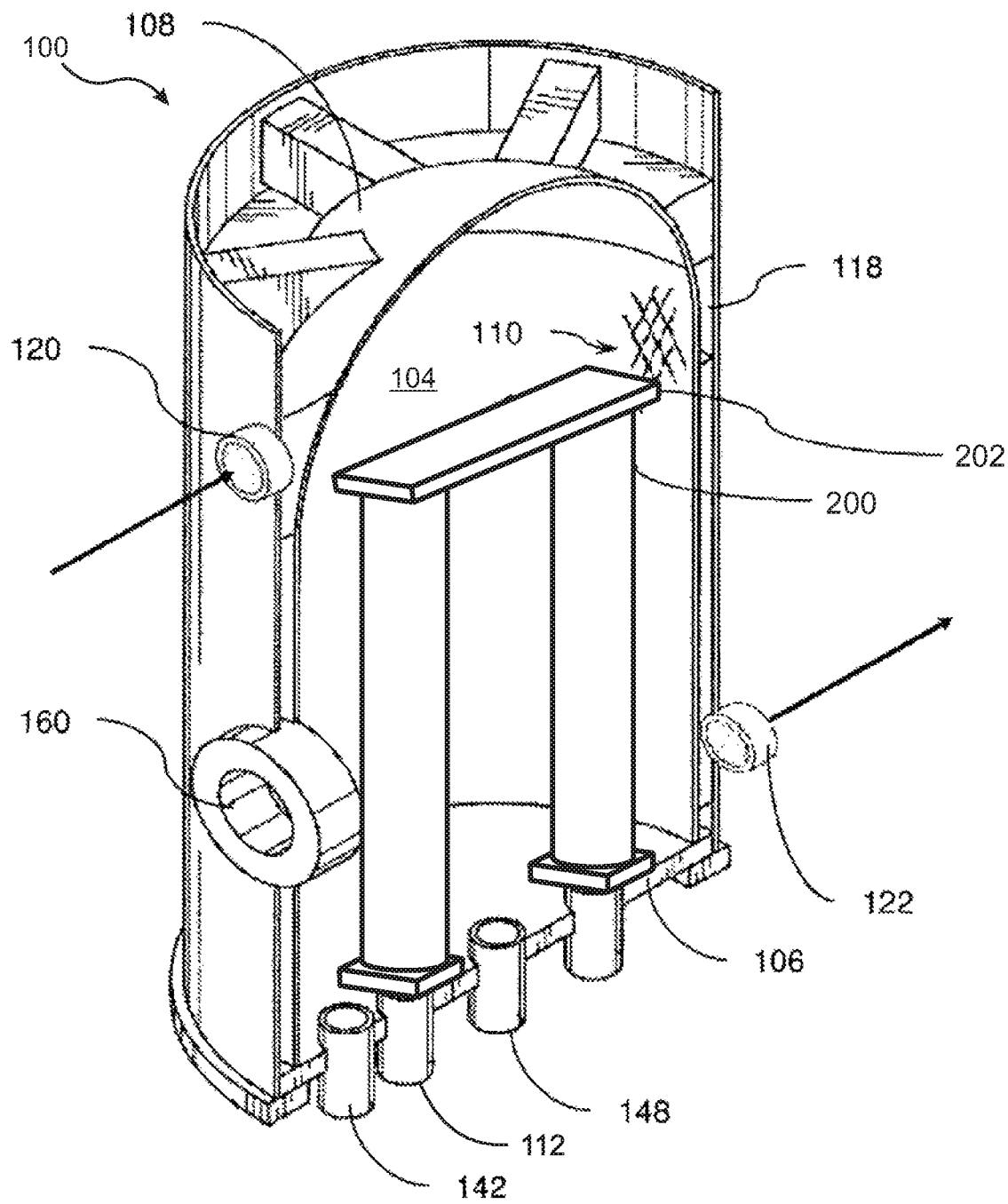
FIG. 2 is a cut-away schematic illustration of a prior art CVD reactor similar to FIG. 1, but containing a tubular filament, wherein the illustration is applicable to both the prior art and to embodiments of the present invention.

One or more particular aspects of the invention can be directed to a fabrication system, such as a CVD reactor, for producing a semiconductor material, such as silicon. In particular, with reference again to FIG. 1, the chemical vapor deposition reactor comprises a reaction chamber 104 defined by or having a base plate 106 and an enclosure 108 securable to the base plate 106. More specifically, the reactor comprises filament supports 112 in the base plate 106, with at least one filament 144, such as a silicon filament (slim rod or tubular) positioned on the filament supports 112 and disposed within the interior of the reaction chamber 104. In addition, the reactor comprises electrical feedthroughs 114 in the base plate 106 which are adapted for connection of an electric current source to both ends of the filaments 144 for heating the filaments 144, as well as a gas inlet 142 and a gas outlet 148, preferably in the base plate 106. The gas inlet 142 is connectible to a source of reaction gas, such as a silicon-containing gas, and the gas outlet 148 is positioned so that gas, such as unreacted reaction gas or gaseous reaction byproducts, may be released from the reaction chamber 104, as needed.

The enclosure 108 of the reaction chamber 104 has a radiation shield 110 comprised of a reflective layer of metal nitride, which is typically disposed on an interior surface of the enclosure 108. The radiation shield 110 effects at least partial reflectance of incident infra-red radiation during production of the semiconductor product, and thereby at least partially reduces radiation heat transfer to the enclosure 108 from the semiconductor product. Note that, as used herein, the term "infrared radiation" refers to light having a wavelength between 0.8 microns and 15 microns. Thus, the reactor comprises a reaction chamber 104 having an enclosure 108 with at least a portion of its interior surface coated with a metal nitride 110 that provides a reflectivity to internal infra-red radiation at least comparable to prior art gold coatings. In embodiments, the metal nitride layer 110 has a thickness that is between 0.1 microns and 10 microns. In some of these embodiments, the thickness of the metal nitride layer 110 is between 4 microns and 5 microns. In various embodiments, the compound is titanium nitride. In other embodiments the compound is zirconium nitride. In yet other embodiments, the compound is hafnium nitride. In still other embodiments, the compound is a nitride of another metal. The enclosure 108, which can be comprised of a metal such as any of the various grades of stainless steel alloys or other nickel alloys, may further comprise a cooling conduit 118 in thermal communication with the radiation shield 110.

Figure 3:
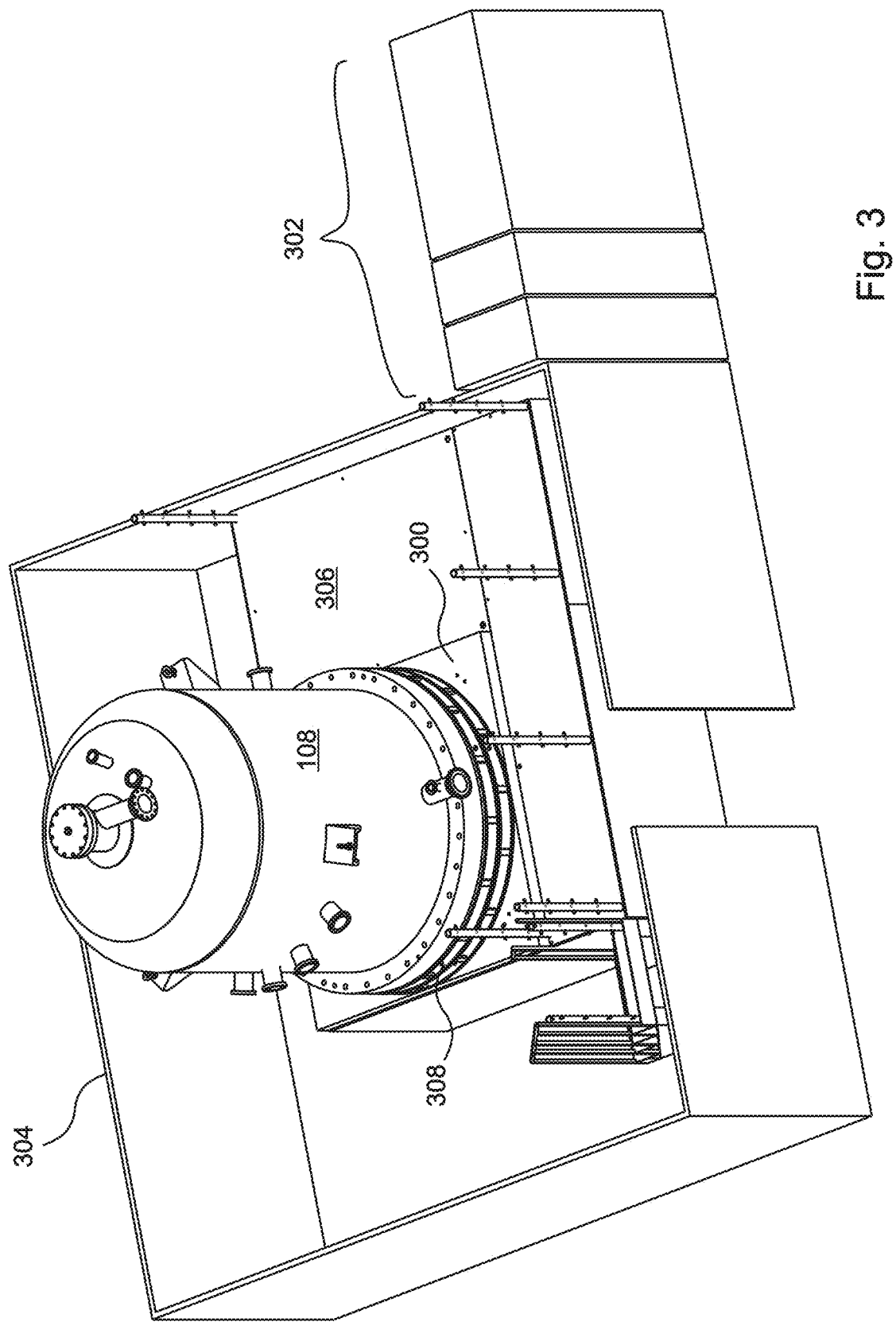
FIG. 3 is a top perspective view of a CVD reactor chamber mounted on a deposition baseplate in a metal nitride deposition apparatus in an embodiment of the present invention.

A second general aspect of the present invention is an efficient and economical method for producing an improved reaction chamber enclosure with an internal metal nitride layer. With reference to FIG. 3, the method includes providing a deposition base plate 300 that is compatible with the reaction chamber enclosure, and mounting the enclosure to the deposition base plate to form a deposition chamber. In the embodiment of FIG. 3, the reaction chamber enclosure is a bell jar cover for a CVD reactor. A pair of seal rings 308 is interposed between the enclosure 108 and the deposition base plate 300. The bottom seal ring connects to the deposition base plate 300 and the top seal ring connects to the enclosure 108. In between these two seal rings 308 is a large non-conductive gasket (not shown) that is used to electrically isolate the enclosure 108 from the deposition base plate

300 during a cleaning step in the process in which a voltage is applied to the enclosure 108. The deposition base plate 300 is placed on a support platform 306 through which various services are provided from below the deposition baseplate 300. The enclosure 108 is then sealed to the deposition base plate 300, thereby forming a deposition chamber. Deposition methods that can be employed for producing the metal nitride layer on the inner surface of the enclosure 108 include physical vapor deposition (PVD) and all the variations thereupon, such as Magnetron Sputtering, Ionbeam Assisted Magnetron Sputtering, Cathodic Arc, Filtered Cathodic Arc, Electron Beam Evaporation, and Thermal Evaporation. CVD or thermal spray can also be used as a deposition method. A set of control electronics 302 is provided according to the deposition method, and in embodiments a safety barrier 304 surrounds the apparatus to protect the operators.

The cost of producing the metal nitride coated reaction chamber enclosure is reduced due to several factors. First, the titanium nitride or other metal nitride compound is significantly less expensive than gold. Second, the method used for depositing the metal nitride compound does not produce toxic effluents, and therefore does not require special, high cost effluent disposal. In addition, the cost of the deposition apparatus is reduced by using the reactor chamber enclosure itself 108 as the metal nitride deposition chamber enclosure.

In embodiments, the relative concentrations of metal and nitrogen used for depositing the metal nitride layer is varied during the deposition period, thereby creating a metal nitride layer having a metal concentration that is not uniform across a thickness of the metal nitride layer.

Figure 4:
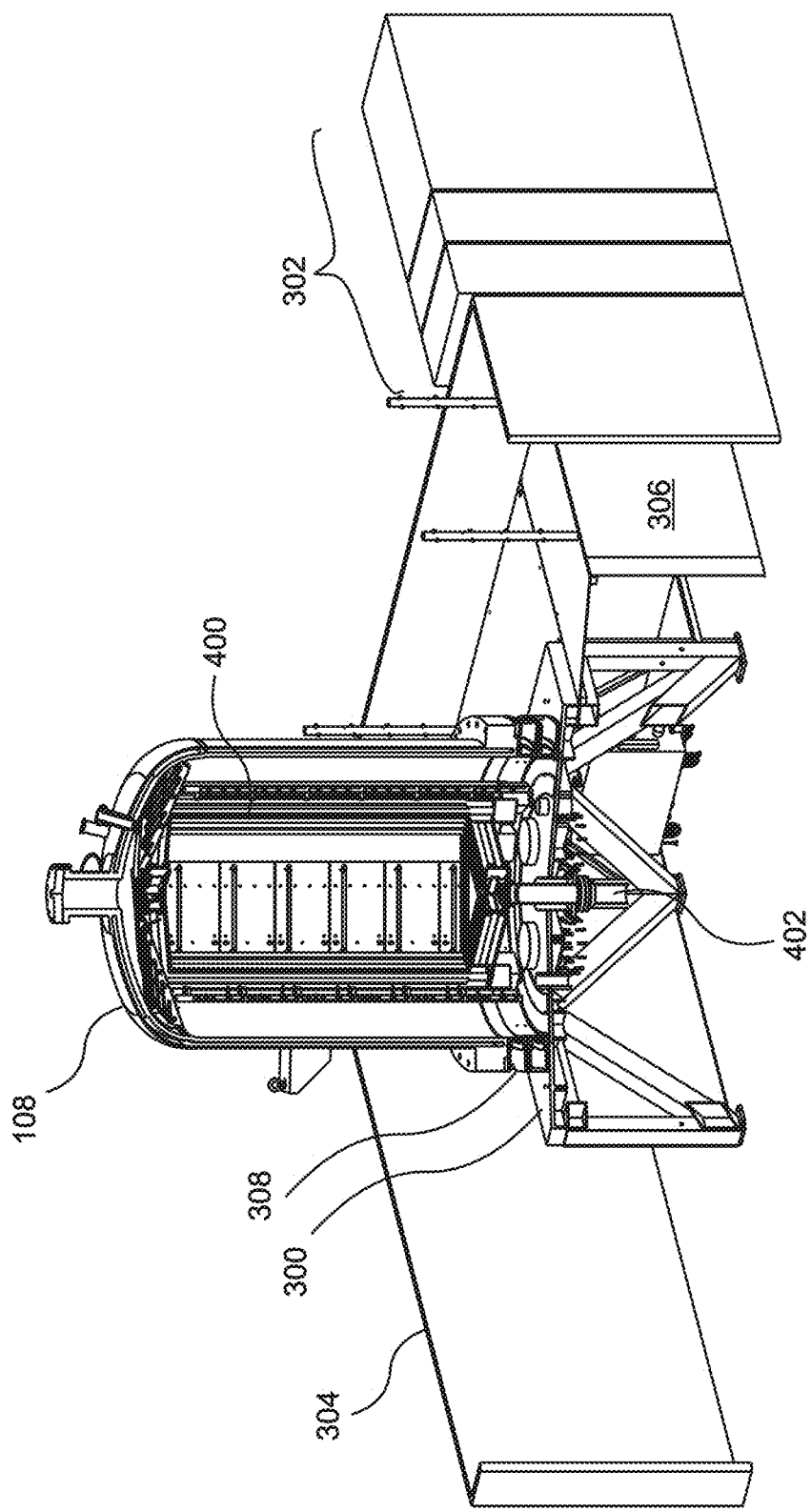
FIG. 4 is a cut-away side view of the reactor chamber and deposition apparatus of FIG. 3, illustrating the location of the deposition source within the chamber.

FIG. 4 is a cut-away side view of an embodiment that uses PVD deposition. The PVD source 400 is rotatable about its central axis 402 by a mechanism that is actuated by the deposition control electronics 302. In the embodiment of FIG. 4, the source includes two crossed orthogonal loops of material formed in a shape that approximates the interior shape of the reaction chamber 108. A top view is provided in FIG. 5.

In embodiments, an intermediate metal layer is applied to the interior surface of the enclosure before the metal nitride layer is applied, so that the intermediate layer is between the interior surface and the layer of metal nitride. In some of these embodiments, the intermediate metal layer is a layer of titanium, zirconium, or hafnium.

In embodiments, during the deposition period the uniformity of deposition of the metal nitride layer onto the interior walls of the CVD reactor chamber is enhanced by periodically rotating the deposition source clockwise through a rotation angle T and then counterclockwise through an angle T', where T and T' differ by an incremental angle d. These alternated rotations are repeated until the source has been rotated clockwise and then counterclockwise a total of N times, where N is 360/d times an integer. For example, T can be 180 degrees, T' can be 178 degrees, and N can be 180 (or a multiple of 180), thereby causing the source orientation after each pair of clockwise and counterclockwise rotations to be incremented by an angle of two degrees until it traverses a full circle and is returned to its original orientation. A similar result can be obtained for example if T is 178 degrees and T' is 180 degrees.

An example where T is 180 degrees, T' is 182 degrees, and the number of rotation pairs is 180 is illustrated in FIGS. 6A through 6F. FIG. 6A shows the original orientation of the source 400. FIG. 6B shows the orientation after one pair of rotations. At the end of the first pair of rotations (first by T clockwise and then by T' counterclockwise), the resulting orientation differs from the original orientation by 2 degrees. FIG. 6C shows the orientation after 40 pairs of rotations, FIG. 6D shows the orientation after 90 pairs of rotations, and FIG. 6E shows the orientation after 120 pairs of rotations. The letters A, B, C, and D are provided in the drawings only to indicate differences between orientations that might otherwise be indistinguishable from each other due to symmetry. Finally, FIG. 6F shows the orientation of the source 400 after 180 pairs of rotations, whereby the source 400 has returned to its original orientation.

Figure 7:
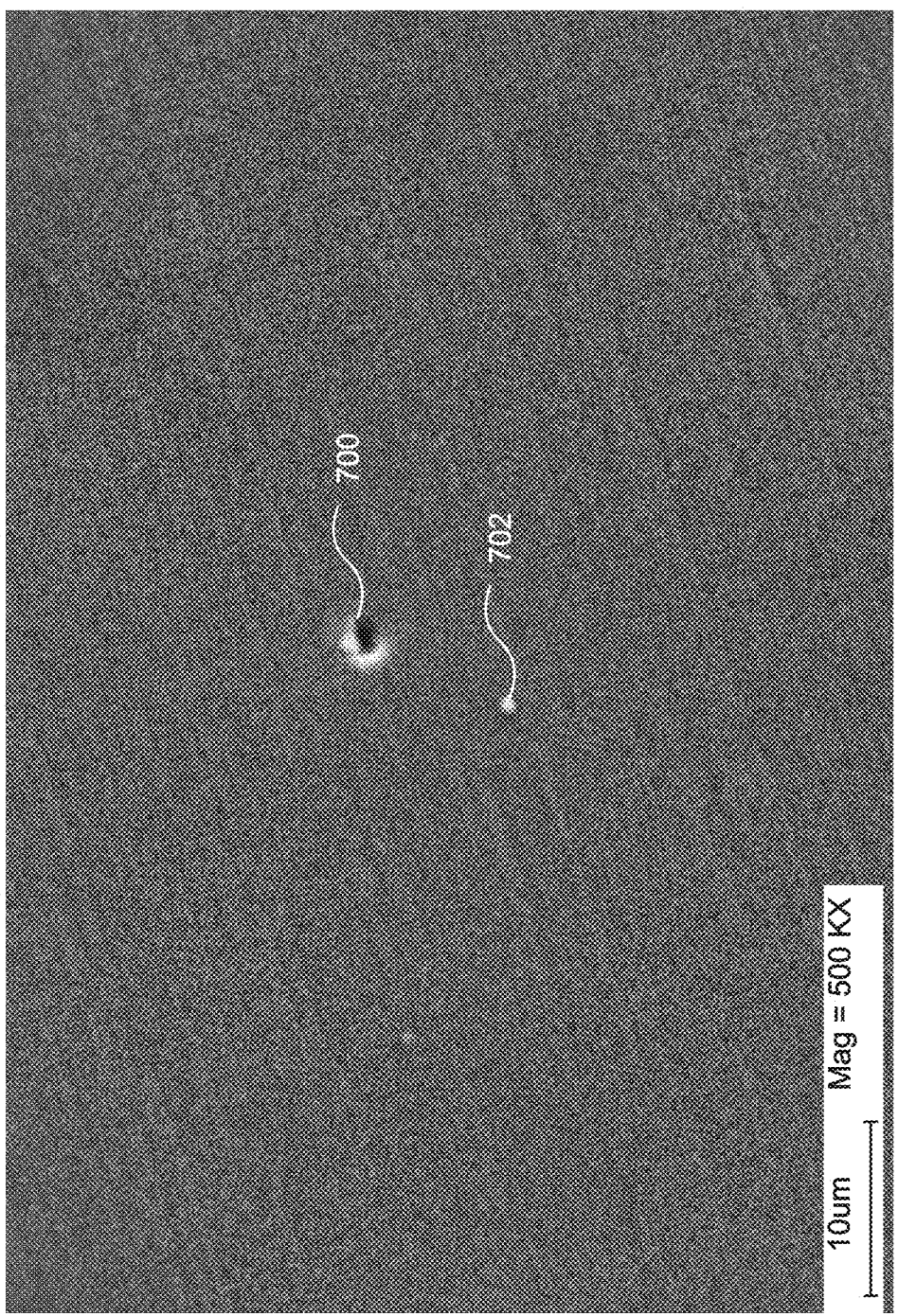
FIG. 7 is a scanning electron microscope image of a titanium nitride layer disposed on a stainless steel sample by PVD via magnetron sputtering.

FIG. 7 is an scanning electron microscope image showing a titanium nitride layer disposed on a stainless steel sample by PVD via magnetron sputtering. Note the smooth layer with relatively few pits 700 and macroparticles 702 of deposited titanium.

Figure 8:
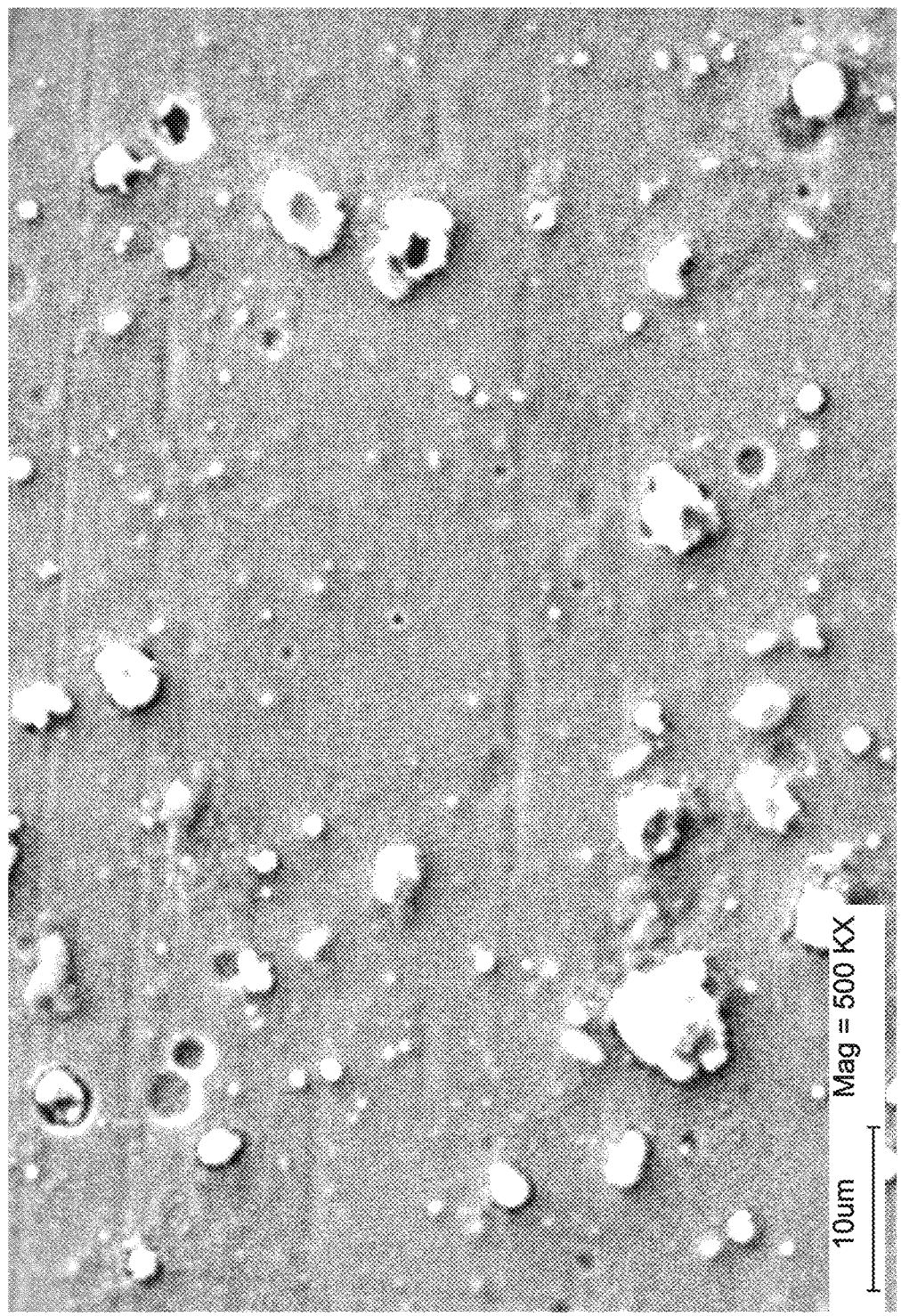
FIG. 8 is a scanning electron microscope image of a titanium nitride layer disposed on a stainless steel sample by PVD via cathodic arc.
Figure 9:
FIG. 9 is a scanning electron microscope image of a titanium nitride layer disposed on a stainless steel sample by CVD.

FIG. 8 is a scanning electron microscope image of a titanium nitride layer disposed on a stainless steel sample by PVD via cathodic arc, and FIG. 9 is a scanning electron microscope image of a Titanium nitride layer disposed on a stainless steel sample by CVD.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

I claim:

1. A method of applying a metal nitride layer onto an inner surface of an enclosure for a chemical vapor deposition ("CVD") reactor, the method comprising:
   providing a CVD enclosure that is configured for attachment to a reactor base plate so as to form a reaction chamber within which materials placed within the reaction chamber can be heated to achieve melting and/or deposition of a chemical agent upon said materials;
   attaching a compatible deposition base plate to the CVD enclosure so that the deposition base plate and the CVD enclosure, in combination, form a sealed deposition chamber, the deposition base plate including a metal nitride deposition source extending from the deposition base plate into an interior of the deposition chamber, said deposition base plate being distinct from said reactor base plate; and
   depositing a metal nitride layer from the deposition source onto an interior surface of the CVD enclosure during a deposition period.

2. The method of claim 1, further comprising varying relative concentrations of metal and nitrogen while depositing the metal nitride layer, thereby creating a metal nitride layer having a metal concentration that is not uniform across a thickness of the metal nitride layer.

3. The method of claim 1, wherein the metal nitride layer has an average reflectivity of at least 90% for all infrared radiation having a wavelength between 0.8 microns and 15 microns.

4. The method of claim 1, wherein the metal nitride layer is able to withstand CVD enclosure wall temperatures up to at least 250° C. without failure.

5. The method of claim 1, further comprising depositing the metal nitride layer until it has a thickness in the range 0.1 to 10 microns.

6. The method of claim 1, further comprising depositing the metal nitride layer until it has a thickness in the range 4 to 5 microns.

7. The method of claim 1, wherein the deposition source can be rotated, and the method further comprises rotating the deposition source during the deposition period.

8. The method of claim 7, wherein the deposition source is rotated alternately in a clockwise direction and in a counterclockwise direction, said clockwise and counterclockwise rotations being of unequal rotation angles that differ from each other by an increment angle d, said clockwise rotations being repeated N times and said counterclockwise rotations being repeated N times during the deposition period, N being equal to 360/d multiplied by an integer.

9. The method of claim 1, wherein the metal nitride layer is deposited by magnetron sputtering, ion beam assisted magnetron sputtering, cathodic arc deposition, filtered cathodic arc deposition, electron beam evaporation, or thermal evaporation.

10. The method of claim 1, further comprising depositing an intermediate metal layer onto the interior surface of the CVD enclosure before depositing the layer of metal nitride onto the interior surface of the CVD enclosure.

11. The method of claim 10, wherein the intermediate metal layer is a layer of titanium, zirconium, or hafnium.

12. The method of claim 1, wherein the metal nitride layer comprises titanium nitride.

13. The method of claim 1, wherein the metal nitride layer comprises zirconium nitride.

14. The method of claim 1, wherein the metal nitride layer comprises hafnium nitride.

15. The method of claim 1, wherein the CVD enclosure comprises a grade of stainless steel alloy or another nickel alloy.

16. The method of claim 1, wherein the CVD enclosure is configured for attachment to the reactor base plate so as to form a reaction chamber within which polysilicon is deposited onto a heated filament.

17. The method of claim 1, wherein the metal nitride layer is able to withstand CVD enclosure wall temperatures up to at least 300° C. without failure.

18. The method of claim 1, further comprising:
varying relative concentrations of metal and nitrogen while depositing the metal nitride layer, thereby creating a metal nitride layer having a metal concentration that is not uniform across a thickness of the metal nitride layer;
wherein the metal nitride layer has an average reflectivity of at least 90% for all infrared radiation having a wavelength between 0.8 microns and 15 microns; and
wherein the metal nitride layer is able to withstand CVD enclosure wall temperatures up to at least 250° C. without failure.

19. The method of claim 1, further comprising, after the deposition period:
removing the deposition base plate from the CVD enclosure;
attaching to the CVD enclosure a compatible reactor base plate comprising filament supports and electrical feed-throughs, so that the reactor base plate and the CVD enclosure, in combination, form a sealed CVD reaction chamber;
mounting a CVD deposition filament on the filament supports;
heating the filament; and
depositing polysilicon onto the heated filament within the CVD reaction chamber.

20. A method of applying a metal nitride layer onto an inner surface of an enclosure for a chemical vapor deposition ("CVD") reactor, the method comprising:
providing a CVD enclosure that is configured for attachment to a reactor base plate so as to form a reaction chamber within which materials placed within the reaction chamber can be heated to achieve melting and/or deposition of a chemical agent upon said materials;
attaching a compatible deposition base plate to the CVD enclosure so that the deposition base plate and the CVD enclosure, in combination, form a sealed deposition chamber, the deposition base plate including a metal nitride deposition source extending from the deposition base plate into an interior of the deposition chamber, said deposition base plate being distinct from said reactor base plate;
depositing metal nitride from the deposition source onto an interior surface of the CVD enclosure during a deposition period while varying relative concentrations of metal and nitrogen, thereby creating a metal nitride layer on the interior surface of the CVD enclosure having a metal concentration that is not uniform across a thickness of the metal nitride layer, and imparting to the enclosure a high thermal efficiency at elevated temperatures;
wherein the metal nitride layer has an average reflectivity of at least 90% for all infrared radiation having a wavelength between 0.8 microns and 15 microns;
wherein the metal nitride layer is able to withstand CVD enclosure wall temperatures up to at least 250° C. without failure;
wherein the deposition source is rotated alternately in a clockwise direction and in a counterclockwise direction during the deposition period, said clockwise and counterclockwise rotations being of unequal rotation angles that differ from each other by an increment angle d, said clockwise rotations being repeated N times and said counterclockwise rotations being repeated N times during the deposition period, N being equal to 360/d multiplied by an integer; and
wherein the metal nitride layer is deposited by magnetron sputtering, ion beam assisted magnetron sputtering, cathodic arc deposition, filtered cathodic arc deposition, electron beam evaporation, or thermal evaporation;
removing the deposition base plate from the CVD enclosure;
attaching to the CVD enclosure a compatible reactor base plate comprising filament supports and electrical feed-throughs, so that the reactor base plate and the CVD enclosure, in combination, form a sealed CVD reaction chamber;
mounting a CVD deposition filament on the filament supports;
heating the filament; and
depositing polysilicon onto the heated filament within the CVD reaction chamber.

* * * * *